United States Patent
Zanbaghi et al.

(10) Patent No.: US 11,290,070 B2
(45) Date of Patent: Mar. 29, 2022

(54) COMMON-MODE LEAKAGE ERROR CALIBRATION FOR CURRENT SENSING IN A CLASS-D STAGE USING A PILOT TONE

(71) Applicant: Cirrus Logic International Semiconductor Ltd., Edinburgh (GB)

(72) Inventors: Ramin Zanbaghi, Austin, TX (US); Cory J. Peterson, Austin, TX (US); Eric Kimball, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 151 days.

(21) Appl. No.: 16/869,226

(22) Filed: May 7, 2020

(65) Prior Publication Data
US 2021/0351751 A1   Nov. 11, 2021

(51) Int. Cl.
| | |
|---|---|
| *H02M 3/15* | (2006.01) |
| *H03F 3/21* | (2006.01) |
| *H03F 3/217* | (2006.01) |
| *G01R 1/20* | (2006.01) |
| *G01R 19/00* | (2006.01) |
| *H03K 4/06* | (2006.01) |
| *H03K 7/08* | (2006.01) |

(52) U.S. Cl.
CPC ........... *H03F 3/2173* (2013.01); *G01R 1/203* (2013.01); *G01R 19/0092* (2013.01); *H03K 4/06* (2013.01); *H03K 7/08* (2013.01); *H03F 2200/351* (2013.01); *H03F 2200/462* (2013.01); *H03F 2200/481* (2013.01)

(58) Field of Classification Search
CPC .............................. H02M 1/088; H03F 3/217
See application file for complete search history.

(56) References Cited

U.S. PATENT DOCUMENTS

| | | |
|---|---|---|
| 7,053,806 B1 | 5/2006 | Rao et al. |
| 8,803,569 B1 | 8/2014 | Malladi et al. |
| 9,319,033 B1 | 4/2016 | Jin et al. |
| | (Continued) | |

OTHER PUBLICATIONS

U.S. Appl. No. 16/660,100, entitled Direct Driver Voltage to Ramp Signal Generation, filed Oct. 22, 2019.

*Primary Examiner* — Patricia T Nguyen
(74) *Attorney, Agent, or Firm* — Jackson Walker L.L.P.

(57) ABSTRACT

A system may include a Class-D stage comprising a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal. The system may also include current sensing circuitry comprising a sense resistor, such that an output current through a load coupled between the first output terminal and the second output terminal causes a first sense voltage proportional to the output current across the sense resistor. The system may additionally include a modulator for generating a differential pulse-width modulation driving signal to the first high-side switch, the second high-side switch, the first low-side switch, and the second low-side switch and pilot tone injection circuitry configured to inject a periodic pilot tone into the differential pulse-width modulation driving signal at a pilot tone frequency.

21 Claims, 6 Drawing Sheets

(56) References Cited

U.S. PATENT DOCUMENTS

| | | | | |
|---|---|---|---|---|
| 2003/0006749 A1* | 1/2003 | Rollman | ............... | G01R 19/25 |
| | | | | 324/76.11 |
| 2008/0246455 A1* | 10/2008 | Chu | ................... | H02M 3/1588 |
| | | | | 323/283 |
| 2012/0013321 A1* | 1/2012 | Huang | .............. | H02M 3/33523 |
| | | | | 323/282 |
| 2013/0136278 A1* | 5/2013 | Quilter | .................. | G10H 3/187 |
| | | | | 381/118 |
| 2013/0173980 A1* | 7/2013 | Xi | ....................... | H02M 3/156 |
| | | | | 714/746 |
| 2018/0115250 A1* | 4/2018 | Ng | ....................... | H02M 3/156 |
| 2018/0331624 A1* | 11/2018 | Pullen | .................. | H02M 3/156 |

* cited by examiner

US 11,290,070 B2

COMMON-MODE LEAKAGE ERROR CALIBRATION FOR CURRENT SENSING IN A CLASS-D STAGE USING A PILOT TONE

FIELD OF DISCLOSURE

The present disclosure relates in general to circuits for audio devices, piezoelectric devices, and/or haptic-feedback devices, including without limitation personal audio devices such as wireless telephones, media players, and mobile devices, and more specifically, to using a pilot tone to calibrate for leakage error in current measurement of a Class-D stage.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones, one or more speakers, a piezoelectric transducer, a haptic feedback transducer, and/or other transducer. Such circuitry often includes a driver including a power amplifier for driving a transducer output signal to the transducer. Oftentimes, a power converter may be used to provide a supply voltage to a power amplifier in order to amplify a signal driven to speakers, headphones, piezoelectric transducers, haptic feedback transducers, or other transducers.

In many of such devices, a transducer may be driven with a Class-D driver stage, which may also be known as an H-bridge driver. FIG. 1 depicts an example of a Class-D driver stage 1 as is known in the art, having a voltage supply $V_{SUPPLY}$, high-side driver switches 2, low-side driver switches 4, and a current sense resistor 8 having a resistance $R_{SNS}$. In operation, switches 2 and 4 may be commutated by pulse-width modulated signals to drive a desired output voltage $V_{OUT}$ to transducer 6, causing an output current $I_{OUT}$ through transducer 6. A sense voltage $V_{SNS}$ may exist across sense resistor 8 equal to the product of output current $I_{OUT}$ and resistance $R_{SNS}$. Because sense voltage $V_{SNS}$ is linearly proportional to output current $I_{OUT}$, sense voltage $V_{SNS}$ may be indicative of output current $I_{OUT}$, and may thus be used by measurement circuitry, control circuitry, and/or other circuitry of a device comprising driver stage 1 and transducer 6 as a quantity representative of output current $I_{OUT}$.

While the topology depicted in FIG. 1 allows for sense resistor 8 to sense the complete output current $I_{OUT}$ through transducer 6, such topology does have disadvantages. For example, a common-mode component of sense voltage $V_{SNS}$ may exist at the negative polarity node of $V_{SNS}$, such common-mode component moving between supply voltage $V_{SUPPLY}$ and ground due to the periodic commutation of switches 2 and 4. Thus, the topology of FIG. 1 may be highly sensitive to common-mode leakage current through sense resistor 8, which may lead to a significant non-zero sense voltage $V_{SNS}$ even in the absence of transducer 6.

SUMMARY

In accordance with the teachings of the present disclosure, one or more disadvantages and problems associated with existing approaches to measuring current through a transducer driven by a Class-D output stage may be reduced or eliminated.

In accordance with embodiments of the present disclosure, a system may include a Class-D stage comprising a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal. The system may also include current sensing circuitry comprising a sense resistor, such that an output current through a load coupled between the first output terminal and the second output terminal causes a first sense voltage proportional to the output current across the sense resistor. The system may additionally include a modulator for generating a differential pulse-width modulation driving signal to the first high-side switch, the second high-side switch, the first low-side switch, and the second low-side switch and pilot tone injection circuitry configured to inject a periodic pilot tone into the differential pulse-width modulation driving signal at a pilot tone frequency.

In accordance with these and other embodiments of the present disclosure, a method may be provided for use in a Class-D stage comprising a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal. The method may include sensing current with a sense resistor, such that an output current through a load coupled between the first output terminal and the second output terminal causes a first sense voltage proportional to the output current across the sense resistor. The method may also include generating a differential pulse-width modulation driving signal to the first high-side switch, the second high-side switch, the first low-side switch, and the second low-side switch. The method may further include injecting a periodic pilot tone into the differential pulse-width modulation driving signal at a pilot tone frequency.

In accordance with embodiments of the present disclosure, an amplifier may include an input for receiving an input signal for amplification, a modulator for receiving the input signal or a signal derived from the input signal and configured to generate a differential pulse-width modulation driving signal as a function of the input signal, a Class-D stage, a sense resistor coupled to the Class-D stage, and pilot tone injection circuitry. The Class-D stage may include a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal, wherein to the first high-side switch, the second high-side switch, the first low-side switch, and the second low-side switch are configured to receive the differential pulse-width modulation driving signal. An output current through a load coupled between the first output terminal and the second output terminal may cause a first sense voltage proportional to the output current across the sense resistor. The pilot tone injection circuitry may be configured to inject a periodic pilot tone into the differential pulse-width modulation driving signal at a pilot tone frequency.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
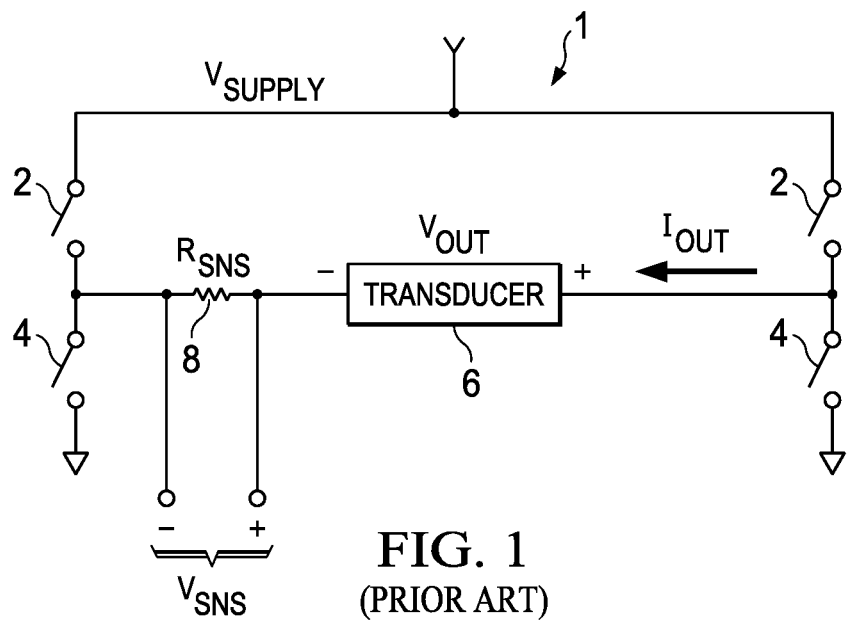
FIG. 1 illustrates an example circuit topology for a Class-D driver and transducer, as is known in the art.
Figure 2:
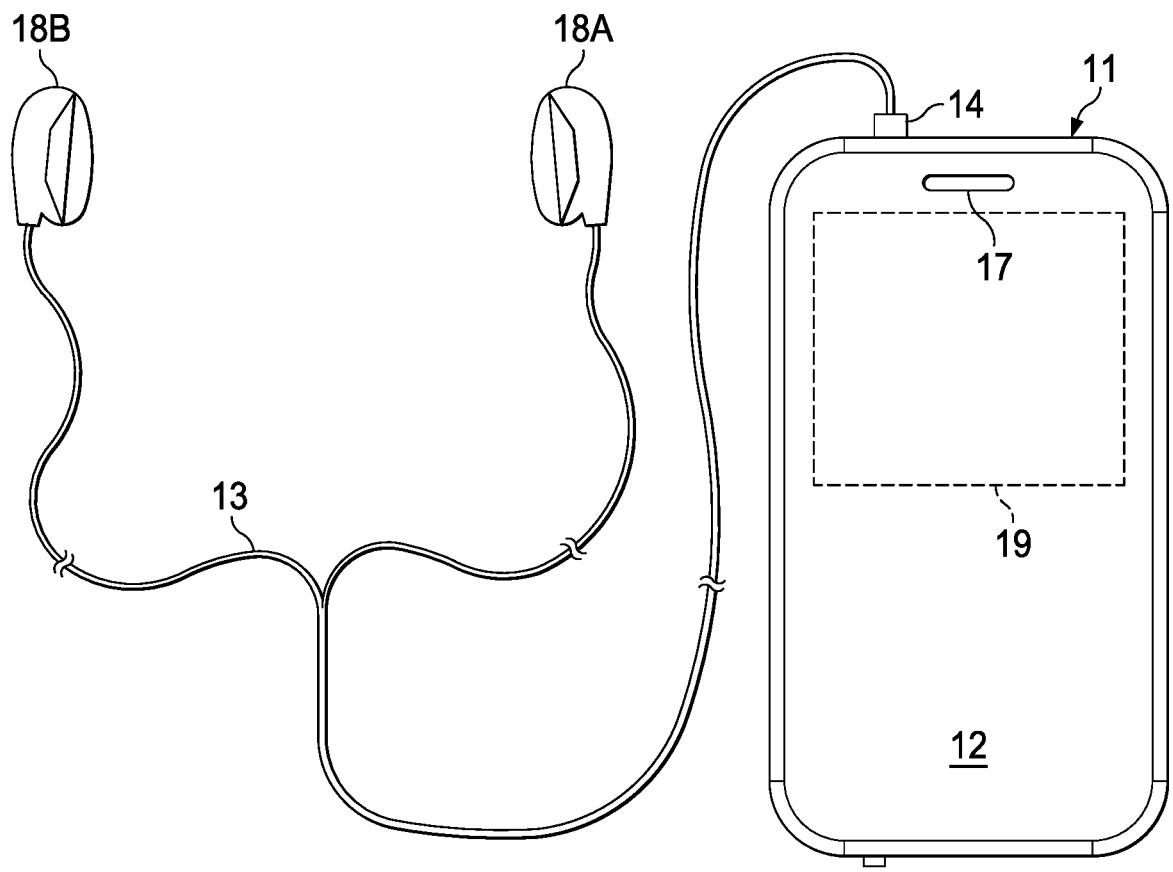
FIG. 2 illustrates an example personal mobile device, in accordance with embodiments of the present disclosure.

FIG. 2 illustrates an example personal mobile device 11, in accordance with embodiments of the present disclosure. FIG. 2 depicts personal mobile device 11 having a speaker 17. Speaker 17 is merely an example, and it is understood that personal mobile device 11 may be used in connection with a variety of transducers including magnetic coil loudspeakers, piezo speakers, haptic feedback transducers, and others. In addition or alternatively, personal mobile device 11 may be coupled to a headset 13 in the form of a pair of earbud speakers 18A and 18B. Headset 13 depicted in FIG. 1 is merely an example, and it is understood that personal mobile device 11 may be used in connection with a variety of audio transducers, including without limitation, headphones, earbuds, in-ear earphones, and external speakers. A plug 14 may provide for connection of headset 13 to an electrical terminal of personal mobile device 11. Personal mobile device 11 may provide a display to a user and receive user input using a touch screen 12, or alternatively, a standard liquid crystal display (LCD) may be combined with various buttons, sliders, and/or dials disposed on the face and/or sides of personal mobile device 11. As also shown in FIG. 2, personal mobile device 11 may include an integrated circuit (IC) 19 for generating an analog signal for transmission to speaker 17, headset 13, and/or another transducer.

Figure 3:
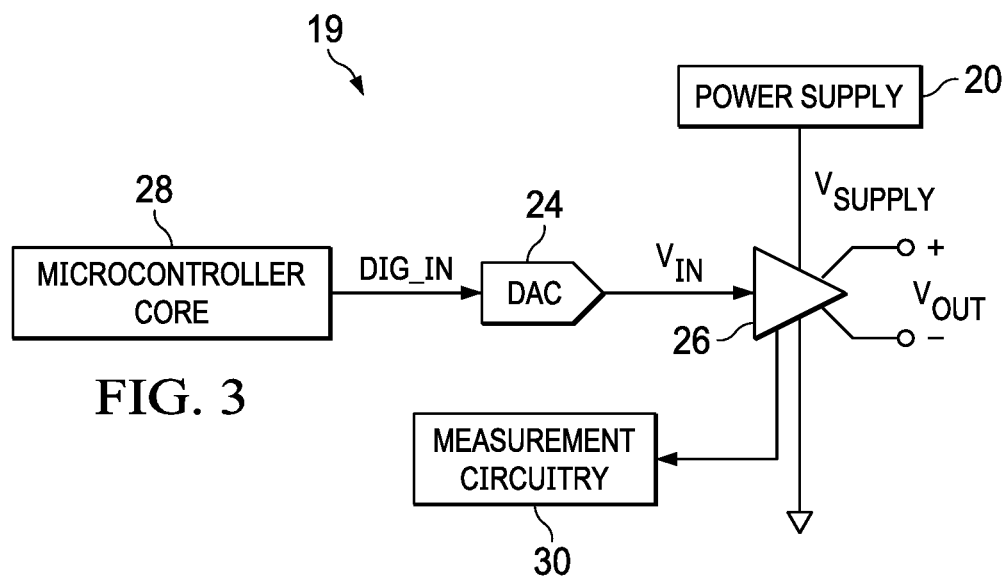
FIG. 3 illustrates a block diagram of selected components of an example integrated circuit of a personal mobile device for driving a transducer, in accordance with embodiments of the present disclosure.

FIG. 3 illustrates a block diagram of selected components of an example IC 19 of a personal mobile device for driving a transducer, in accordance with embodiments of the present disclosure. As shown in FIG. 3, a microcontroller core 28 may supply a digital input signal DIG_IN to a digital-to-analog converter (DAC) 24, which may convert the digital input signal to an analog input signal Vu. In some embodiments, analog signal $V_{IN}$ may comprise a pulse-width modulated signal. In addition, although analog signal $V_{IN}$ is shown in FIG. 3 as a single-ended signal, in some embodiments analog signal $V_{IN}$ may comprise a differential signal. DAC 24 may supply analog signal $V_{IN}$ to an amplifier 26 which may amplify or attenuate analog input signal $V_{IN}$ to provide a differential output signal $V_{OUT}$, which may operate a speaker, a headphone transducer, a piezoelectric transducer, a haptic feedback transducer, a line level signal output, and/or other suitable output. In some embodiments, DAC 24 may be an integral component of amplifier 26, particularly in embodiments in which analog input signal $V_{IN}$ is a pulse-width modulated signal for driving switches of amplifier 26. In these and other embodiments, amplifier 26 may comprise a Class-D driver stage. A power supply 20 may provide the power supply rail inputs of amplifier 26.

As also depicted in FIG. 3, IC 19 may also include measurement circuitry 30. Measurement circuitry 30 may comprise any suitable system, device, or apparatus configured to receive one or more signals indicative of a physical quantity associated with amplifier 26 (e.g., an electrical current driven to a load of amplifier 26) and condition the one or more signals for further processing.

Although FIGS. 2 and 3 contemplate that IC 19 resides in a personal mobile device, systems and methods described herein may also be applied to electrical and electronic systems and devices other than a personal mobile device, including transducer systems for use in a computing device larger than a personal mobile device, an automobile, a building, or other structure.

Figure 4:
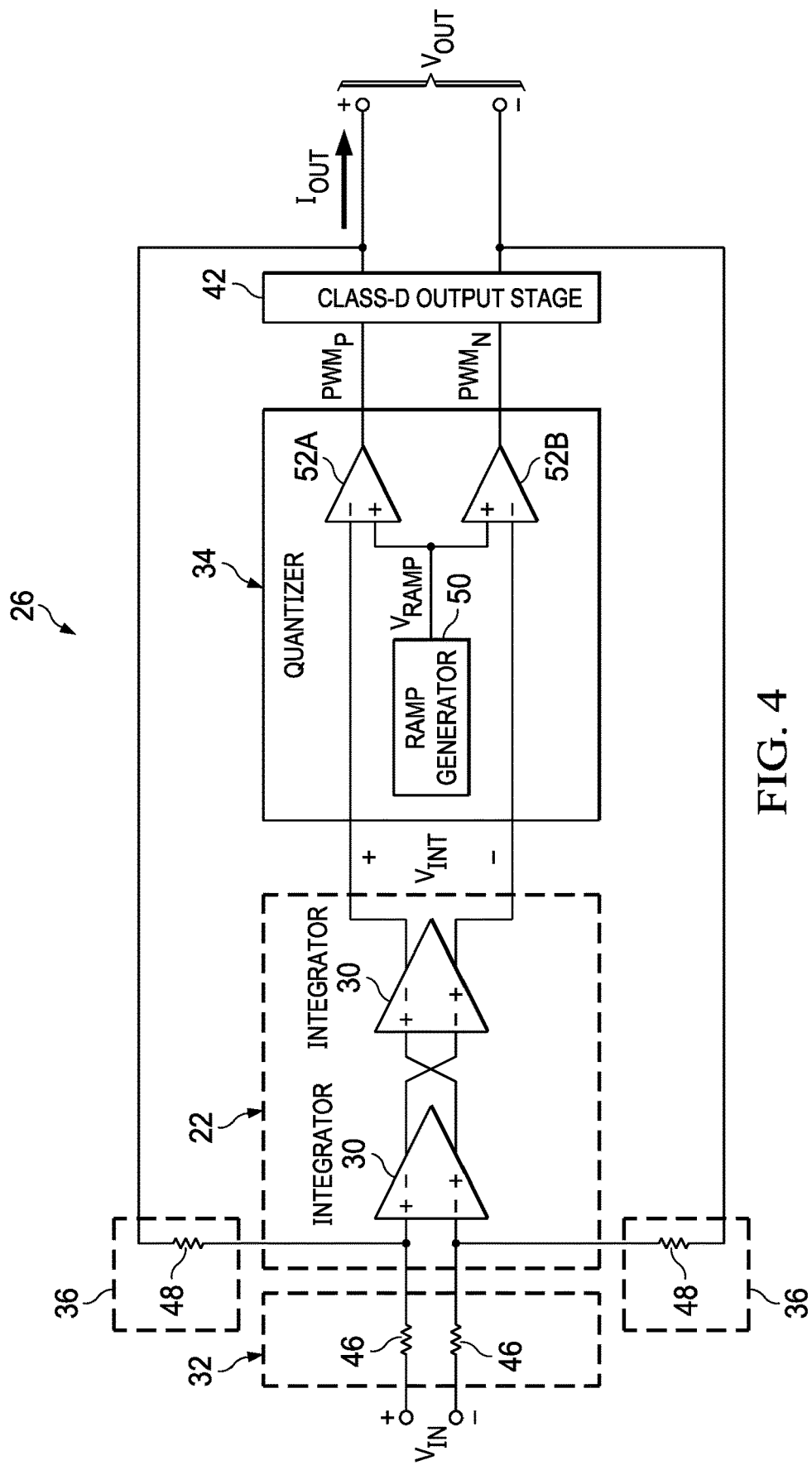
FIG. 4 illustrates a block diagram of selected components of an example amplifier, in accordance with embodiments of the present disclosure.

FIG. 4 illustrates a block diagram of selected components of an example amplifier 26, in accordance with embodiments of the present disclosure. As shown in FIG. 4, amplifier 26 may include a signal input network 32, a first stage 22 (e.g., an analog front end) configured to receive analog input signal $V_{IN}$ at an amplifier input of amplifier 26 and generate an intermediate signal $V_{INT}$ which is a function of analog input signal $V_{IN}$, a quantizer 34, a final output stage comprising a Class-D output stage 42 configured to generate output signal $V_{OUT}$ at an amplifier output of amplifier 26 as a function of quantized intermediate signal $V_{INT}$, and a signal feedback network 36 coupled between the amplifier output and the amplifier input.

Signal input network 32 may include any suitable input network receiving the amplifier input of amplifier 26. For example, as shown in FIG. 4, signal input network 32 may include input resistors 46.

First stage 22 may include any suitable analog front end circuit for conditioning analog input signal $V_{IN}$ for use by Class-D output stage 42. For example, first stage 22 may include one or more analog integrators 30 cascaded in series, as shown in FIG. 4. For ease of exposition, FIG. 4 does not explicitly depict feedforward and/or feedback networks that may be present within first stage 22 between the various inputs and outputs of integrators 30. However, in actual implementation, such feedforward and/or feedback networks may be present.

Quantizer 34 may comprise any system, device, or apparatus configured to quantize intermediate signal $V_{INT}$ to generate an equivalent digital PWM signal. For example, as shown in FIG. 5, the equivalent digital PWM signal may be a differential PWM signal $P_{DIFF}$ equal to the difference between positive polarity PWM signal $PWM_P$ and a negative polarity PWM signal $PWM_N$, wherein positive polarity PWM signal $PWM_P$ is used to drive switches of Class-D output stage 42 for driving the positive polarity of output signal $V_{OUT}$ and negative polarity PWM signal $PWM_N$ is used to drive switches of Class-D output stage 42 for driving the negative polarity of output signal $V_{OUT}$.

Figure 5:
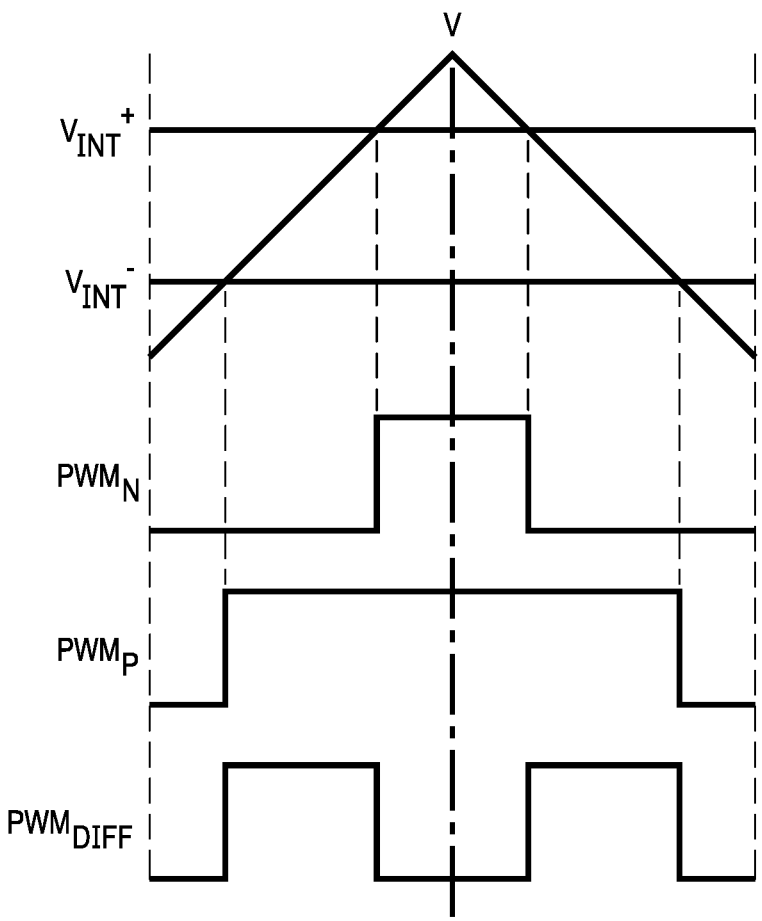
FIG. 5 illustrates example waveforms depicting normal operation of a quantizer of the amplifier shown in FIG. 4, in accordance with embodiments of the present disclosure.

As shown in FIG. 4, quantizer 34 may include comparators 52 (e.g., comparators 52A and 52B) that may, during normal operation, compare intermediate signal $V_{INT}$ (or voltages generated from intermediate signal $V_{INT}$) to a periodic triangular waveform $V_{RAMP}$ generated by ramp generator 50 to generate a pulse-width modulated output signal $PWM_{DIFF}=PWM_P-PWM_N$ from quantizer 34, as shown in FIG. 5.

Class-D output stage 42 may comprise any system, device, or apparatus configured to receive the output of quantizer 34 and drive an output signal $V_{OUT}$ which is an amplified version of analog input signal $V_{IN}$. Accordingly, Class-D output stage 42 may comprise a plurality of output switches configured to generate output signal $V_{OUT}$ from a modulated signal generated by quantizer 34. After amplification by Class-D output stage 42, its output pulse train may be converted back to an unmodulated analog signal by passing through a passive low-pass filter, wherein such low-pass filter may be inherent in output circuitry of Class-D output stage 42 or a load driven by Class-D output stage 42.

Signal feedback network 36 may include any suitable feedback network for feeding back a signal indicative of output signal $V_{OUT}$ to the amplifier input of amplifier 26. For example, as shown in FIG. 4, signal feedback network 36 may include variable feedback resistors 48. Those of skill in the art may recognize that a closed loop gain of amplifier 26 may be set by a ratio of the resistances of variable feedback resistors 48 to the resistances of variable input resistors 46.

Figure 6A:
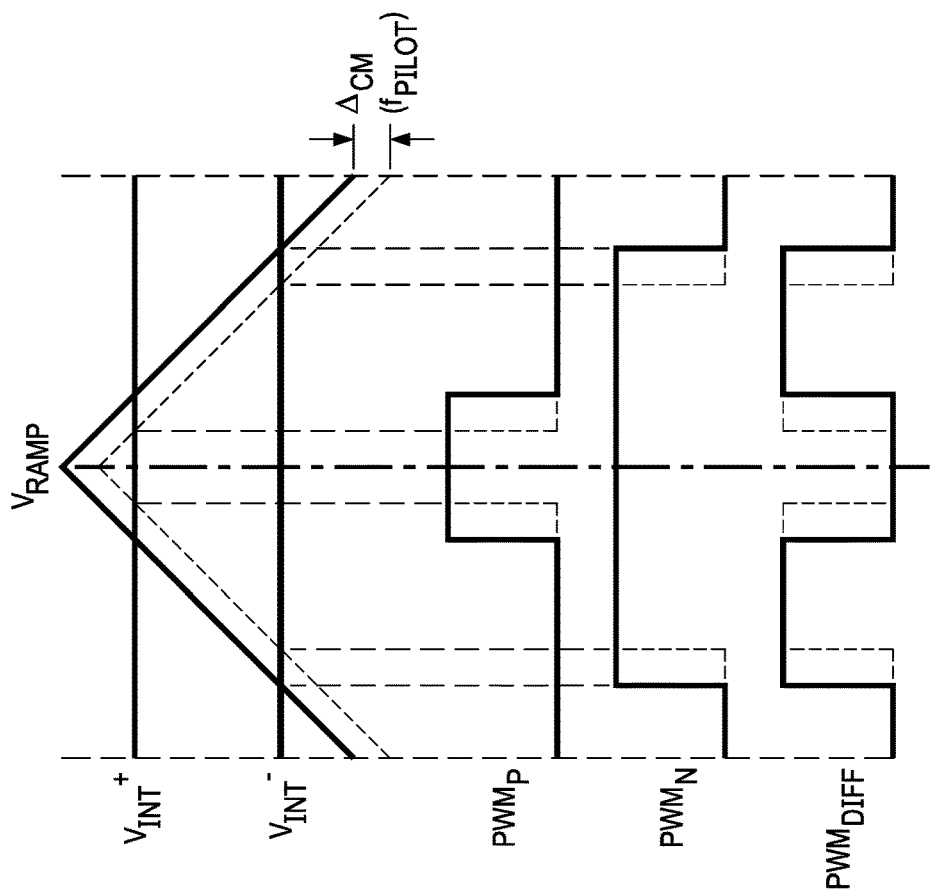
FIGS. 6A and 6B illustrate example waveforms depicting operation of the quantizer of the amplifier shown in FIG. 4 with a common mode voltage of a periodic triangular waveform being modulated at a pilot frequency, in accordance with embodiments of the present disclosure.
Figure 6B:
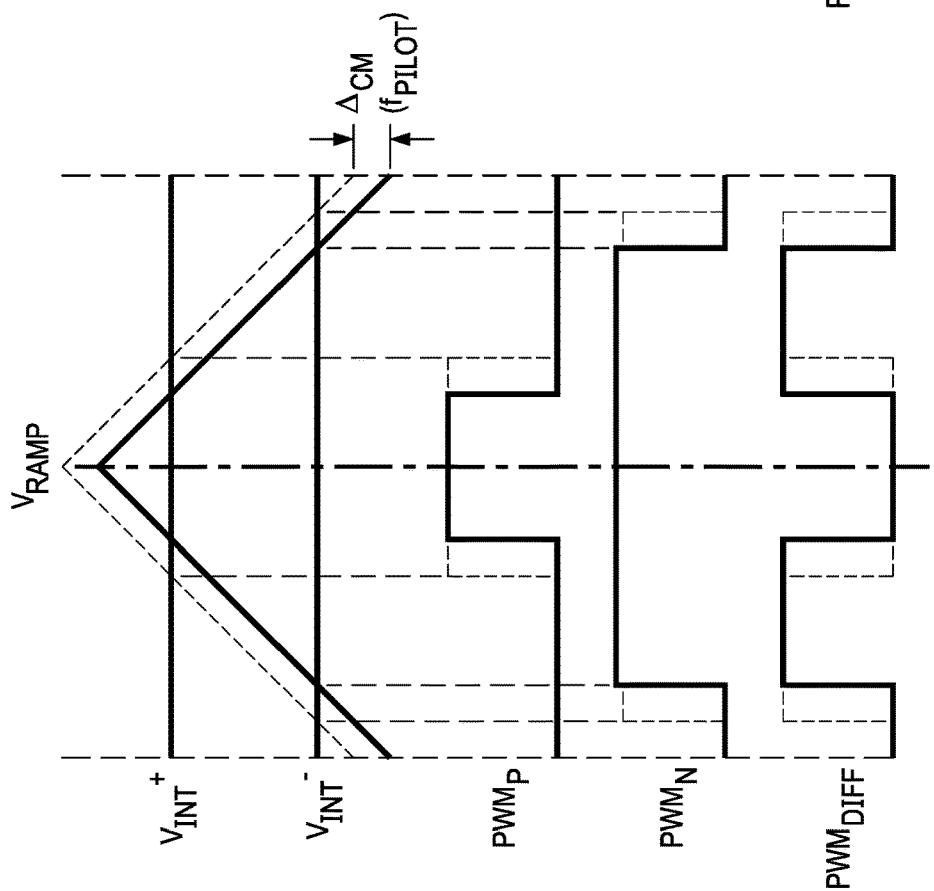

To isolate and compensate for common-mode leakage in the measurement of current through a sense resistor of Class-D output stage 42, ramp generator 50 may further be configured to modulate a common-mode offset of periodic triangular waveform $V_{RAMP}$ at a pilot tone frequency $f_{PILOT}$. In other words, ramp generator 50 may, as described in greater detail below, inject a pilot tone into its ramp generation that may alternate, at pilot tone frequency $f_{PILOT}$ which may be significantly outside the frequency band of interests of output signal $V_{OUT}$, between adding a constant $\Delta V_{CM}$ to (as shown in FIG. 6A) and subtracting the constant $\Delta V_{CM}$ from (as shown in FIG. 6B) periodic triangular waveform $V_{RAMP}$. As shown in FIG. 6A, adding constant $\Delta V_{CM}$ to periodic triangular waveform $V_{RAMP}$ may increase the individual pulse widths of positive polarity PWM signal $PWM_P$ and negative polarity PWM signal $PWM_N$, but maintain differential PWM signal $P_{DIFF}$ at the same pulse width. Likewise, subtracting constant $\Delta V_{CM}$ from periodic triangular waveform $V_{RAMP}$ may decrease the individual pulse widths of positive polarity PWM signal $PWM_P$ and negative polarity PWM signal $PWM_N$, but maintain differential PWM signal $P_{DIFF}$ at the same pulse width. Thus, while common-mode pulse widths for PWM signals generated by quantizer 34 may change due to injection of the pilot signal into periodic triangular waveform $V_{RAMP}$, the fully-differential PWM signal $P_{DIFF}$ may remain intact.

Figure 7:
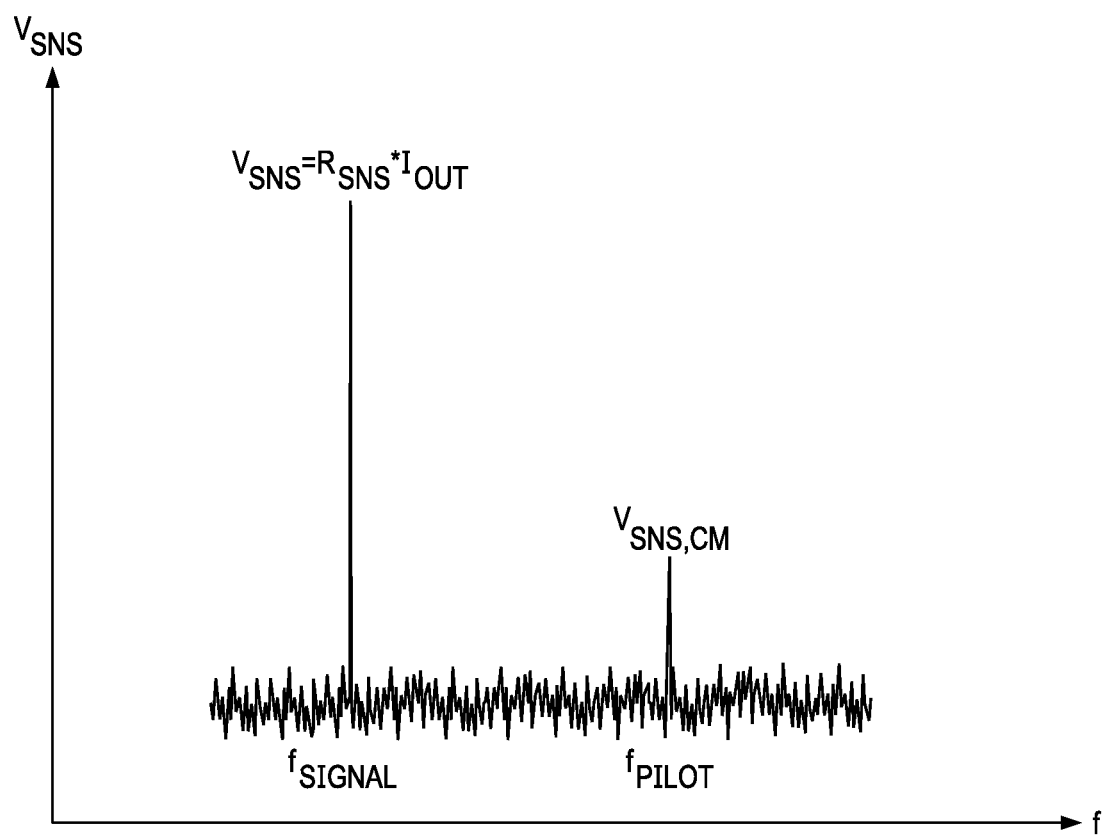
FIG. 7 illustrates example measurements of a sense resistor across a range of frequencies, in accordance with embodiments of the present disclosure.

Accordingly, as shown in FIG. 7, a common-mode leakage gain (represented by voltage $V_{SNS,CM}$ shown in FIG. 7) may be captured at pilot tone frequency $f_{PILOT}$ by a sense resistor in the path of output current $I_{OUT}$, isolated from measurement of output current $I_{OUT}$ at the desired signal frequency $f_{SIGNAL}$ of output voltage $V_{OUT}$. Such common-mode leakage gain may be used by one or more components of personal mobile device 11 to compensate for common-mode leakage in the measurement of output current $I_{OUT}$.

Figure 8:
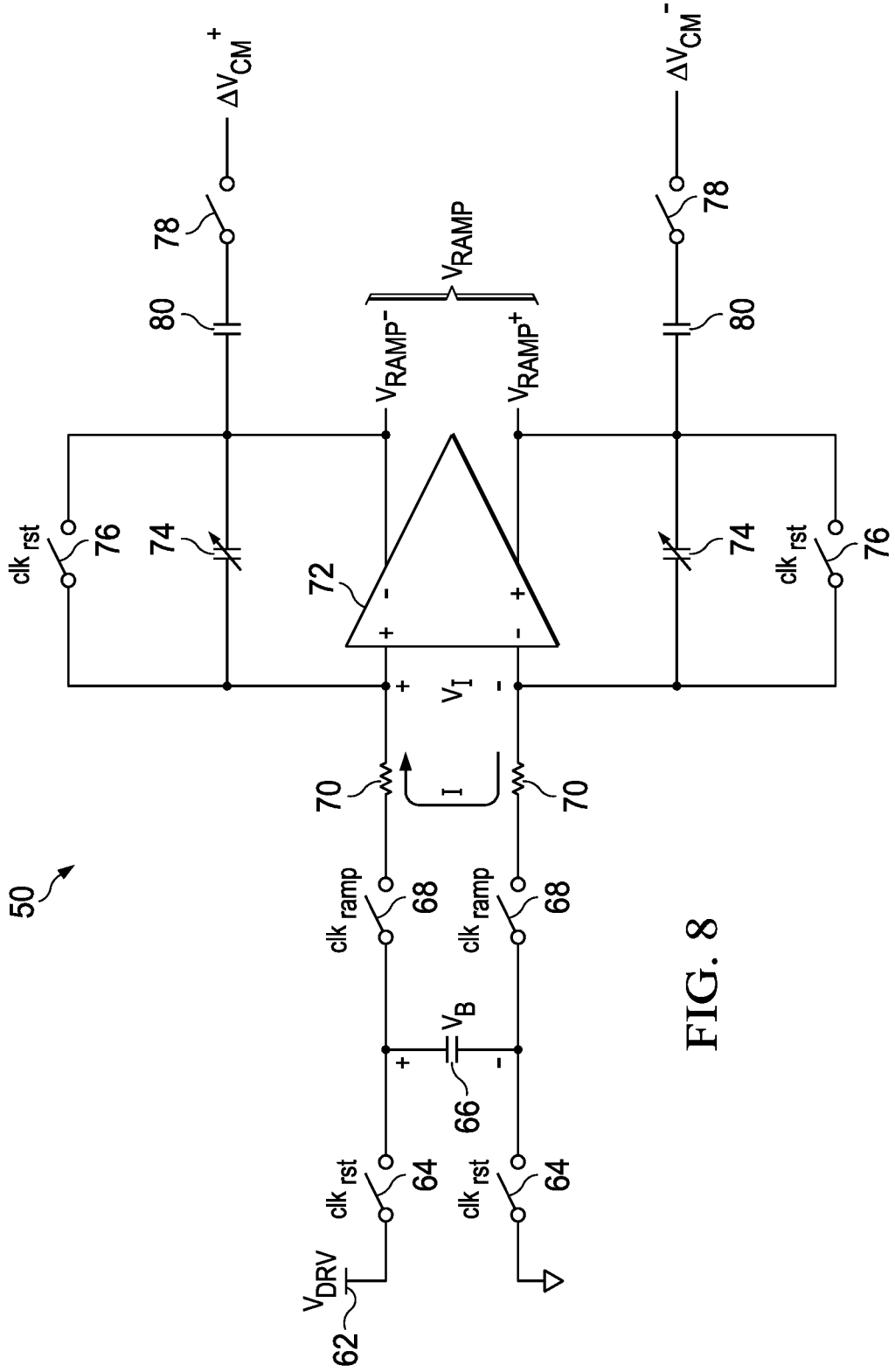
FIG. 8 illustrates a circuit diagram of selected components of an example ramp generator, in accordance with embodiments of the present disclosure.

FIG. 8 illustrates a circuit diagram of selected components of an example ramp generator 50, in accordance with embodiments of the present disclosure. As shown in FIG. 8, ramp generator 50 may include a voltage source 62 that generates a varying or fixed driving voltage $V_{DRV}$, a plurality of reset switches 64, a sampling capacitor 66, a plurality of transfer switches 68, a plurality of input resistors 70, an operational amplifier 72, a plurality of integrating capacitors 74, and a plurality of reset switches 76, arranged as shown in FIG. 8. Ramp generator 50 may also include switched capacitors 80 and pilot injection switches 78, wherein each series combination of a pilot injection switch 78 and switched capacitor 80 is coupled between a polarity of a pilot tone signal $\Delta V_{CM}$ (e.g., $V_{CM}=V_{CM}^+-V_{CM}^-$).

In particular, a reset switch 64 may be coupled between a first (e.g., rail voltage) terminal of voltage source 62 and a first terminal of sampling capacitor 66, and another reset switch 64 may be coupled between a second (e.g., ground) terminal of voltage source 62 and a second terminal of sampling capacitor 66. In addition, one series combination of a transfer switch 68 and an input resistor 70 may be coupled between the first terminal of sampling capacitor 66 and a first (e.g., positive) input terminal of operational amplifier 72 and another series combination of a transfer switch 68 and an input resistor 70 may be coupled between the second terminal of sampling capacitor 66 and a second (e.g., negative) input terminal of operational amplifier 72. One integrating capacitor 74 may be coupled in parallel with a reset switch 76 between the first (e.g., positive) input terminal of operational amplifier 72 and a first inverting (e.g., negative) output terminal of operational amplifier 72, and another integrating capacitor 74 may be coupled in parallel with another reset switch 76 between the second (e.g., negative) input terminal of operational amplifier 72 and a second inverting (e.g., positive) output terminal of operational amplifier 72.

Reset switches 64 and 76 may be controlled by a reset clock signal $clk_{rst}$ such that reset switches 64 and 76 are enabled (e.g., activated, closed, on) when reset clock signal $clk_{rst}$ is asserted and are disabled (e.g., deactivated, open, off) when reset clock signal $clk_{rst}$ is deasserted. Transfer switches 68 may be controlled by a ramp clock signal $clk_{ramp}$ such that transfer switches 68 are enabled (e.g., activated, closed, on) when ramp clock signal $clk_{ramp}$ is asserted and are disabled (e.g., deactivated, open, off) when ramp clock signal $clk_{ramp}$ is deasserted. In operation, reset clock signal $clk_{rst}$ and ramp clock signal $clk_{ramp}$ may be complementary (e.g., reset clock signal $clk_{rst}$ may be asserted when ramp clock signal $clk_{ramp}$ is deasserted, and vice versa).

Ramp generator 50 may periodically operate such that each period of operation of ramp generator 50 includes two phases. A first phase may comprise a sampling phase in which reset clock signal $clk_{rst}$ is asserted and ramp clock signal $clk_{ramp}$ is deasserted. During such sampling phase, reset switches 64 may be enabled and transfer switches 68 may be disabled, allowing a bulk voltage $V_B$ across the terminals of sampling capacitor 66 to charge to driving voltage $V_{DRV}$ via reset switches 64, thus sampling voltage $V_{DRV}$ onto sampling capacitor 66. In the sampling phase, reset switches 76 may also be enabled and may cause each integrating capacitor 74 to be shorted across its terminals by a respective reset switch 76, thus forcing the output terminal voltages $V_{RAMP}{}^+$ and $V_{RAMP}{}^-$ at the output terminals of operational amplifier 72 to a common mode voltage, and forcing a differential output voltage of the operational amplifier to zero. In some embodiments, rather than the "single-sampling" approach depicted in FIG. 8, another sampling capacitor in addition to sampling capacitor 66 may be used to perform doubling sampling.

A second phase may comprise a transfer phase in which reset clock signal $clk_{rst}$ is deasserted and ramp clock signal $clk_{ramp}$ is asserted. During such transfer phase, reset switches 64 and 76 may be disabled and transfer switches 68 may be enabled, allowing bulk voltage $V_B$ to discharge through input resistors 70 to generate a current I which may charge integrating capacitors 74 to increase voltage magnitudes across the terminals of each integrating capacitor 74. Such transfer phase may last for a duration of time $T_{ramp}$. Time $T_{ramp}$ may be selected to be a duration of time significantly shorter than (e.g., less than 10% of) a transient time constant $\tau$ defined by the capacitance of sampling capacitor 66 and the sum of the resistances of input resistors 70. With time $T_{ramp}$ selected to be significantly shorter than transient time constant $\tau$, discharge of charge from sampling capacitor 66 may be linear with respect to time during time $T_{ramp}$, meaning current I may be constant during time $T_{ramp}$, and voltages $V_{RAMP}{}^+$, $V_{RAMP}{}^-$, and $V_{RAMP}$ are linear with respect to time, such that they generate linear ramp-like waveforms.

The above functionality of ramp generation circuit 50 may be further described in U.S. patent application Ser. No. 16/660,100, entitled "Direct Driver Voltage to Ramp Signal Generation," filed on Oct. 22, 2019 by inventor Ramin Zanbaghi and assigned to Cirrus Logic International Semiconductor Ltd, which is incorporated by reference herein in its entirety.

To inject pilot tone $\Delta V_{CM}$ into generation of periodic triangular waveform $V_{RAMP}$, pilot injection switches 78 may be commutated at desired pilot tone frequency $f_{PILOT}$.

Although FIG. 8 describes an example topology for ramp generator 50, it is understood that other topologies of ramp generation circuits may be used in accordance with the systems and methods disclosed herein, having identical or similar approaches to those disclosed herein for injection of a pilot signal into such ramp generation circuits.

Although a particular pilot tone is described above with respect to FIGS. 6-8, any suitable pilot signal may be used, whether the pilot tone be comprised of multiple frequency tones, a single tone, a square wave, a sine wave, or any other suitable signal.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:
1. A system comprising:
a Class-D stage comprising:
a first high-side switch coupled between a supply voltage and a first output terminal of the Class-D stage;
a second high-side switch coupled between the supply voltage and a second output terminal of the Class-D stage;
a first low-side switch coupled between a ground voltage and the first output terminal; and
a second low-side switch coupled between the ground voltage and the second output terminal;
current sensing circuitry comprising a sense resistor, such that an output current through a load coupled between the first output terminal and the second output terminal causes a first sense voltage proportional to the output current across the sense resistor;
a modulator for generating a differential pulse-width modulation driving signal to the first high-side switch, the second high-side switch, the first low-side switch, and the second low-side switch; and
pilot tone injection circuitry configured to inject a periodic pilot tone into the differential pulse-width modulation driving signal at a pilot tone frequency.

2. The system of claim 1, wherein the sense resistor is coupled between the first output terminal and the second output terminal.

3. The system of claim 1, wherein:
the modulator comprises ramp generation for generating a periodic triangular waveform signal used to generate the differential pulse-width modulation driving signal; and
the pilot tone injection circuitry is configured to inject the periodic pilot tone into the periodic triangular waveform signal at a pilot tone frequency.

4. The system of claim 1, wherein the periodic pilot tone has a constant magnitude.

5. The system of claim 1, wherein the pilot tone frequency is significantly outside a signal frequency for a desired signal played back to the load.

6. The system of claim 1, wherein injection of the periodic pilot tone causes a modulation of a common mode pulse width of the differential pulse-width modulation driving signal while maintaining a fully-differential pulse width of the differential pulse-width modulation driving signal substantially unchanged as a result of the modulation of the common mode pulse width.

7. The system of claim 1, further comprising measurement circuitry configured to capture an indication of common-mode leakage of the sense resistor responsive to the periodic pilot tone.

8. A method, in a Class-D stage comprising a first high-side switch coupled between a supply voltage and a first output terminal of the Class-D stage, a second high-side switch coupled between the supply voltage and a second output terminal of the Class-D stage, a first low-side switch coupled between a ground voltage and the first output terminal, and a second low-side switch coupled between the ground voltage and the second output terminal, the method comprising:
sensing current with a sense resistor, such that an output current through a load coupled between the first output terminal and the second output terminal causes a first sense voltage proportional to the output current across the sense resistor;
generating a differential pulse-width modulation driving signal to the first high-side switch, the second high-side switch, the first low-side switch, and the second low-side switch; and
injecting a periodic pilot tone into the differential pulse-width modulation driving signal at a pilot tone frequency.

9. The method of claim 8, wherein the sense resistor is coupled between the first output terminal and the second output terminal.

10. The method of claim 8, wherein injecting the pilot tone comprises injecting the periodic pilot tone into a periodic triangular waveform signal used to generate the differential pulse-width modulation driving signal.

11. The method of claim 8, wherein the periodic pilot tone has a constant magnitude.

12. The method of claim 8, wherein the pilot tone frequency is significantly outside a signal frequency for a desired signal played back to the load.

13. The method of claim 8, wherein injection of the periodic pilot tone causes a modulation of a common mode pulse width of the differential pulse-width modulation driving signal while maintaining a fully-differential pulse width of the differential pulse-width modulation driving signal substantially unchanged as a result of the modulation of the common mode pulse width.

14. The method of claim 8, further comprising capturing an indication of common-mode leakage of the sense resistor responsive to the periodic pilot tone.

15. An amplifier comprising:
an input for receiving an input signal for amplification;
a modulator for receiving the input signal or a signal derived from the input signal and configured to generate a differential pulse-width modulation driving signal as a function of the input signal;
a Class-D stage comprising:
a first high-side switch coupled between a supply voltage and a first output terminal of the Class-D stage;
a second high-side switch coupled between the supply voltage and a second output terminal of the Class-D stage;
a first low-side switch coupled between a ground voltage and the first output terminal; and
a second low-side switch coupled between the ground voltage and the second output terminal;
wherein to the first high-side switch, the second high-side switch, the first low-side switch, and the second low-side switch are configured to receive the differential pulse-width modulation driving signal;
a sense resistor coupled to the Class-D stage, such that an output current through a load coupled between the first output terminal and the second output terminal causes a first sense voltage proportional to the output current across the sense resistor; and
pilot tone injection circuitry configured to inject a periodic pilot tone into the differential pulse-width modulation driving signal at a pilot tone frequency.

16. The amplifier of claim 15, wherein the sense resistor is coupled between the first output terminal and the second output terminal.

17. The amplifier of claim 15, wherein:
the modulator comprises a ramp generation circuit for generating a periodic triangular waveform signal used to generate the differential pulse-width modulation driving signal; and
the pilot tone injection circuitry is configured to inject the periodic pilot tone into the periodic triangular waveform signal at a pilot tone frequency.

18. The amplifier of claim 15, wherein the periodic pilot tone has a constant magnitude.

19. The amplifier of claim 15, wherein the pilot tone frequency is significantly outside a signal frequency for a desired signal played back to the load.

20. The amplifier of claim 15, wherein injection of the periodic pilot tone causes a modulation of a common mode pulse width of the differential pulse-width modulation driving signal while maintaining a fully-differential pulse width of the differential pulse-width modulation driving signal substantially unchanged as a result of the modulation of the common mode pulse width.

21. The amplifier of claim 15, further comprising measurement circuitry configured to capture an indication of common-mode leakage of the sense resistor responsive to the periodic pilot tone.

* * * * *